(12) United States Patent
Suzuki

(10) Patent No.: US 7,097,919 B2
(45) Date of Patent: Aug. 29, 2006

(54) POLYMERIC FLUORESCENT SUBSTANCE, PROCESS FOR PRODUCING THE SAME, AND ORGANIC ELECTROLUMINESCENT ELEMENT

(75) Inventor: Satoshi Suzuki, Tokyo-To (JP)

(73) Assignee: Dai Nippon Printing Co. Ltd, Tokyo (JP)

( * ) Notice: Subject to any disclaimer, the term of this patent is extended or adjusted under 35 U.S.C. 154(b) by 32 days.

(21) Appl. No.: 10/667,563

(22) Filed: Sep. 22, 2003

(65) Prior Publication Data

US 2004/0067388 A1 Apr. 8, 2004

(30) Foreign Application Priority Data

Sep. 24, 2002 (JP) ............................. 2002-277684

(51) Int. Cl.
*H05B 33/14* (2006.01)
*C09K 11/06* (2006.01)

(52) U.S. Cl. ...................... 428/690; 428/917; 313/504; 313/506; 257/40; 252/301.35; 528/403

(58) Field of Classification Search .................. 251/40; 252/301.35; 313/504, 506; 428/690, 917; 257/40; 528/245

See application file for complete search history.

(56) References Cited

U.S. PATENT DOCUMENTS

| | | | | |
|---|---|---|---|---|
| 4,465,835 A | * | 8/1984 | Takizawa et al. | ........... 546/133 |
| 5,247,190 A | | 9/1993 | Friend et al. | |
| 6,949,291 B1 | * | 9/2005 | Holmes et al. | .......... 428/411.1 |

FOREIGN PATENT DOCUMENTS

| JP | 06-016801 | * | 1/1994 |
|---|---|---|---|
| JP | 2002-284862 | * | 10/2002 |

OTHER PUBLICATIONS

Braun et al., "Visible light emission from semiconducting polymer diodes", Appl. Phys. Lett., vol. 58, No. 18, May 6, 1991, pp. 1982-1984.
Burroughes et al., "Light-emitting diodes based on conjugated polymers", Nature, vol. 347, Oct. 11, 1990, pp. 539-541.
Fukuda et al., "Fusible Conducting Poly (9-alkylfluorene) and Poly (9,9-dialkylfluorene) and Their Characteristics", Japanese Journal of Applied Physics, vol. 28, No. 8, Aug. 1989, pp. L 1433-L 1435.
Ohmori et al., "Blue Electroluminescent Diodes Utilizing Poly(alkylfluorene)", Japanese Journal of Applied Physics, vol. 30, No. 11B, Nov. 1991, pp. L 1941-L 1943.
Weinfurtner et al., "Highly efficient pure blue electroluminescence from polyfluorene: Influence of the molecular weight distribution on the aggregation tendency", Applied Physics Letters, vol. 76, No. 18, May 1, 2000, pp. 2502-2504.

* cited by examiner

*Primary Examiner*—Rena Dye
*Assistant Examiner*—Camie S. Thompson
(74) *Attorney, Agent, or Firm*—Harness, Dickey & Pierce, P.L.C.

(57) ABSTRACT

A polymeric fluorescent substance has a prolonged service life and high luminescence brightness. The substance also has excellent thermal stability and good practicality. The polymeric fluorescent substance is adapted for emission of visible fluorescence in a solid state, and includes at least one type of repeating units represented by a specified chemical formula (1). In addition, the substance has a number average molecular weight of $10^3$ to $10^8$ as determined using polystyrene as a standard. A process for producing the polymeric fluorescent substance, and an organic EL element using the polymeric fluorescent substance are also provided.

6 Claims, No Drawings

POLYMERIC FLUORESCENT SUBSTANCE, PROCESS FOR PRODUCING THE SAME, AND ORGANIC ELECTROLUMINESCENT ELEMENT

BACKGROUND OF THE INVENTION

1. Field of the Invention

The present invention relates to a polymeric fluorescent substance and an organic electroluminescent element using the polymeric fluorescent substance.

2. Background Art

Electroluminescent elements ("electroluminescent" being hereinafter often abbreviated to "EL") are luminescent elements utilizing electroluminescence. The construction of electroluminescent elements is basically anode/organic luminescent layer/cathode, and electroluminescent elements, in which a hole injection transport layer or an electron injection layer is properly added to the above basic construction, are known in the art. Among organic EL elements are those using a polymeric fluorescent substance as a luminescent material. For example, a polymeric fluorescent substance of a poly-p-phenylenevinylene derivative is proposed in J. H. Burroughes et al., Nature, vol. 347, P. 539 (1990) and D. Braun et al., Appl. Phys. Lett., vol. 58, P. 1982 (1991).

However, it is difficult to provide blue luminescence from the poly-p-phenylenevinylene derivative. On the other hand, a polyfluorene polymer is proposed in M. Fukuda et al., Jpn. J. Appl. Phys., vol. 28, p. L1433 (1989) and Y. Ohmori et al., Jpn. J. Appl. Phys., vol. 30, p. L1941 (1991). The polyfluorene is thermally and chemically stable and exhibits very strong fluorescence in a solution or solid state. Further, the polyfluorene is very advantageous in that the introduction of a substituent such as a long alkyl chain renders the polyfluorene soluble in organic solvents and thus can provide excellent film forming properties and can relatively easily realize blue luminescence.

However, it has been often pointed out π-conjugated polymers such as poly-p-phenylenevinylene and polyfluorene have liquid crystallinity derived from the molecular structure and, upon heating or the application of an electric field, molecular chains per se associate to form excimer which shifts the luminescence wavelength to a longer wavelength or deteriorates luminescence efficiency.

From the viewpoint of suppressing such excimer luminescence, research and development for enhancing the thermal stability have been made. It is estimated that polymer chains having a high molecular weight have small molecular chain mobility due to such a state that, in high-molecular weight polymer chains, yarn spheres have been entangled with each other while polymer chains having a low molecular weight have large molecular chain mobility and, thus, upon heating or application of an electric field, are unfavorably moved and associate.

The excimer formation is significant particularly in blue luminescent elements. To overcome this drawback, an element comprising a luminescent layer using a polymer, from which a low molecular weight component has been removed by GPC (gel permeation chromatography), is proposed in K.-H. Weinfurtnaer et al., Appl. Phys. Lett., vol. 76, p. 2502 (2000).

In this element, however, the luminescence efficiency at 100 cd/m$^2$ is low and 1.55 cd/A. Thus, there is still a need for a polymeric organic EL element possessing excellent blue luminescence, service life, luminescence efficiency, and thermal stability.

SUMMARY OF THE INVENTION

The present inventor has now found that the utilization of a specific compound can provide a polymeric fluorescent substance, which has excellent service life, luminescence brightness, and thermal stability, and an organic EL element using the polymeric fluorescent substance. The present invention has been made based on such finding.

Thus, according to one aspect of the present invention, there is provided a polymeric fluorescent substance adapted for emission of visible fluorescence in a solid state, said polymeric fluorescent substance comprising at least one type of repeating units represented by chemical formula (1) and having a number average molecular weight of 10$^3$ to 10$^8$ as determined using polystyrene as a standard:

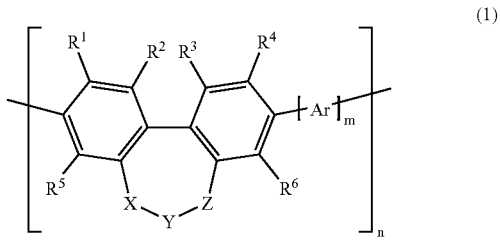

wherein

Ar represents an arylene group having 6 to 60 carbon atoms involved in conjugation or a heterocyclic compound group having 4 to 60 carbon atoms involved in conjugation;

X, Y, and Z represent at least one group selected from the group consisting of an oxygen atom, a sulfur atom, a carbonyl group, a group represented by —C(R)$_2$—, and a group represented by —NR— wherein, when X, Y, and Z contain a substituent R, said substituent R and R$^1$ to R$^6$ in chemical formula (1) each independently represent at least one group selected from the group consisting of a hydrogen atom, an alkyl group having 1 to 20 carbon atoms, an alkoxy group having 1 to 20 carbon atoms, an alkylthio group having 1 to 20 carbon atoms, an alkylsilyl group having 1 to 60 carbon atoms, an alkylamino group having 1 to 40 carbon atoms, an aryl group having 6 to 60 carbon atoms, an arylalkyl group having 7 to 60 carbon atoms, an arylalkoxy group having 7 to 60 carbon atoms, an arylalkynyl group having 8 to 60 carbon atoms, an arylamino group having 6 to 60 carbon atoms, a hetrocylic compound group having 4 to 60 carbon atoms, a cyano group, a nitro group, and a halogen atom;

m is 0 (zero) or 1; and n is a numerical value necessary for meeting the requirement of the number average molecular weight 10$^3$ to 10$^8$ as determined using polystyrene as a standard.

The polymeric fluorescent substance according to the present invention emits strong fluorescence, can realize relatively easy regulation of fluorescence wavelength, has excellent thermal resistance, and is soluble in a solvent and thus can be a good material for organic EL elements. An organic EL element using the polymeric fluorescent substance according to the present invention can be easily prepared by coating, has long service life and excellent luminescence efficiency and thermal resistance, and is suitable for use as luminescent elements for various display devices.

EMBODIMENTS OF INVENTION

According to the present invention, there is provided a process for producing a polymeric fluorescent substance represented by chemical formula (1), comprising the step of polymerizing a monomer represented by formula (2) alone, or polymerizing said monomer represented by formula (2) in combination with an aromatic compound having 6 to 60 carbon atoms involved in conjugation, or with a heterocyclic compound having 4 to 60 carbon atoms involved in conjugation:

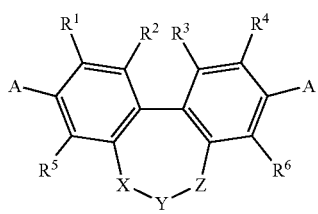

(2)

wherein A represents a hydrogen atom or a halogen atom; and X, Y, Z, and $R_1$ to $R_6$ are as defined in formula (1). A preferably represents a halogen atom, particularly a bromine atom. The monomer represented by formula (2) is preferably a compound represented by formula (3-1) or (3-2):

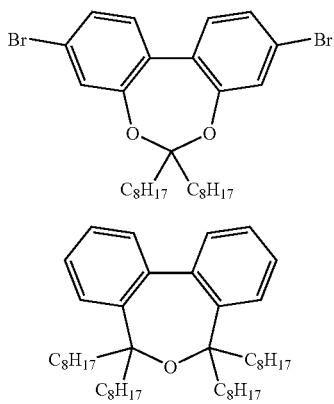

(3-1)

(3-2)

Further, according to the present invention, there is provided an organic EL element comprising a pair of opposed electrodes, an anode and a cathode, and an organic compound layer, having a single-layer or multilayer structure, interposed between said pair of opposed electrodes, said organic compound layer including a layer containing at least one type of the above polymeric fluorescent substance.

In the EL element, preferably, a layer containing an electron transport compound is provided between the cathode and the organic compound layer; a layer containing a hole transport compound is provided between the anode and the organic compound layer; or a layer containing an electron transport compound is provided between the cathode and the organic compound layer and a layer containing a hole transport compound is provided between the anode and the organic compound layer.

DETAILED DESCRIPTION OF THE INVENTION

Polymeric Fluorescent Substance

The polymeric fluorescent substance according to the present invention emits visible fluorescence in a solid state and has a number average molecular weight of $10^3$ to $10^8$ as determined using polystyrene as a standard, includes at least one type of repeating units represented by chemical formula (1), and, preferably, 50 to 100% by mole in total of all of repeating units are accounted for by the total amount of the repeating units represented by chemical formula (1).

Ar in chemical formula (1) represents an arylene group having 6 to 60 carbon atoms involved in conjugation or a heterocyclic compound group having 4 to 60 carbon atoms involved in conjugation. Specific examples of Ar include the following aromatic compound groups or derivative groups thereof.

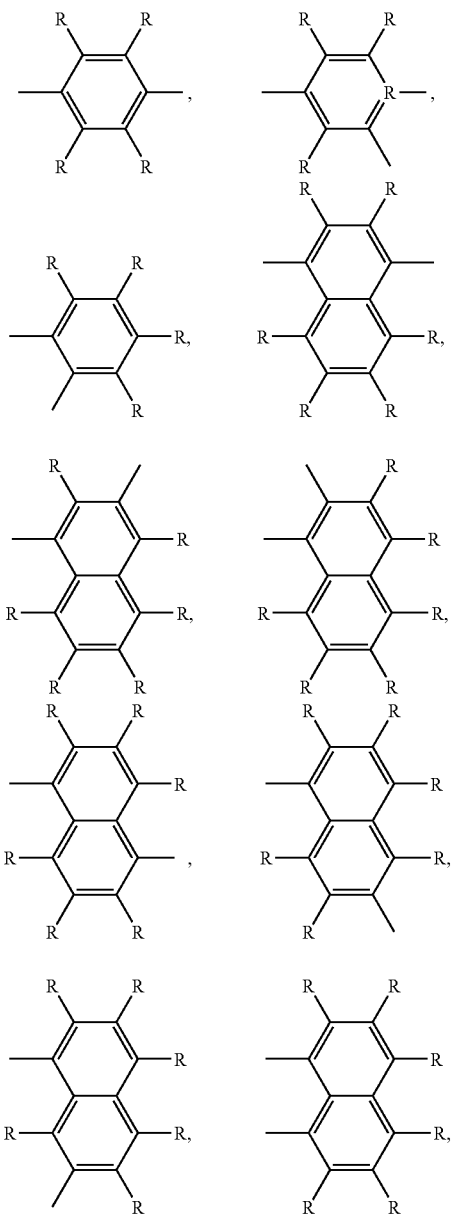

-continued
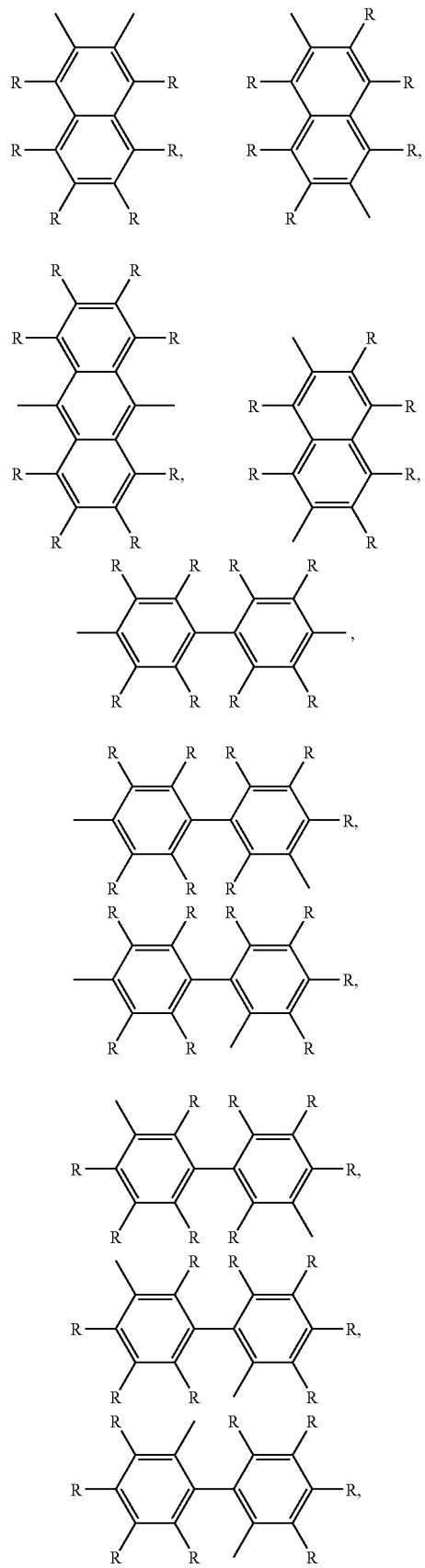
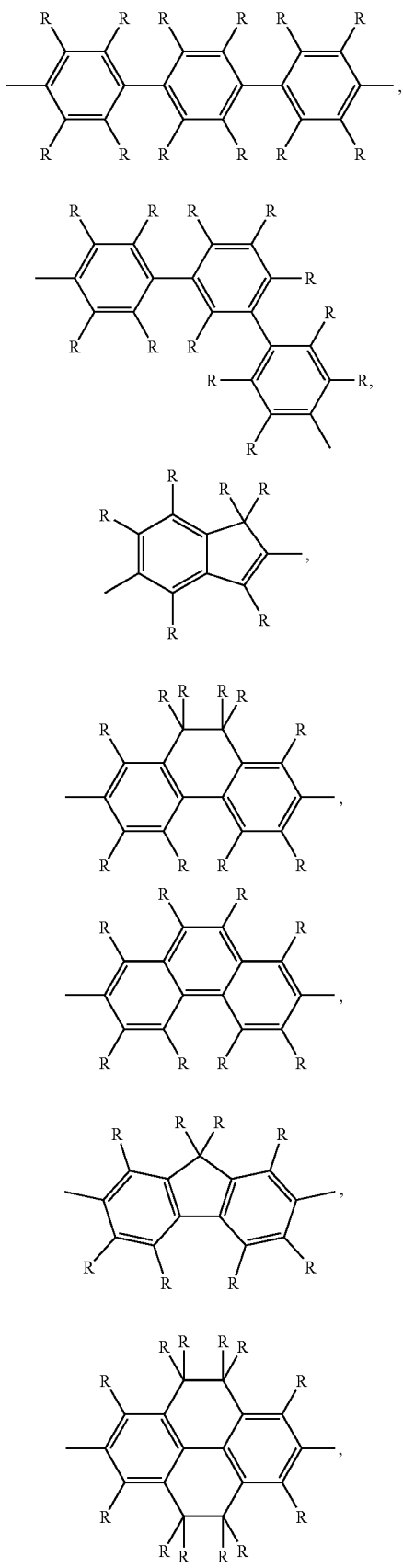

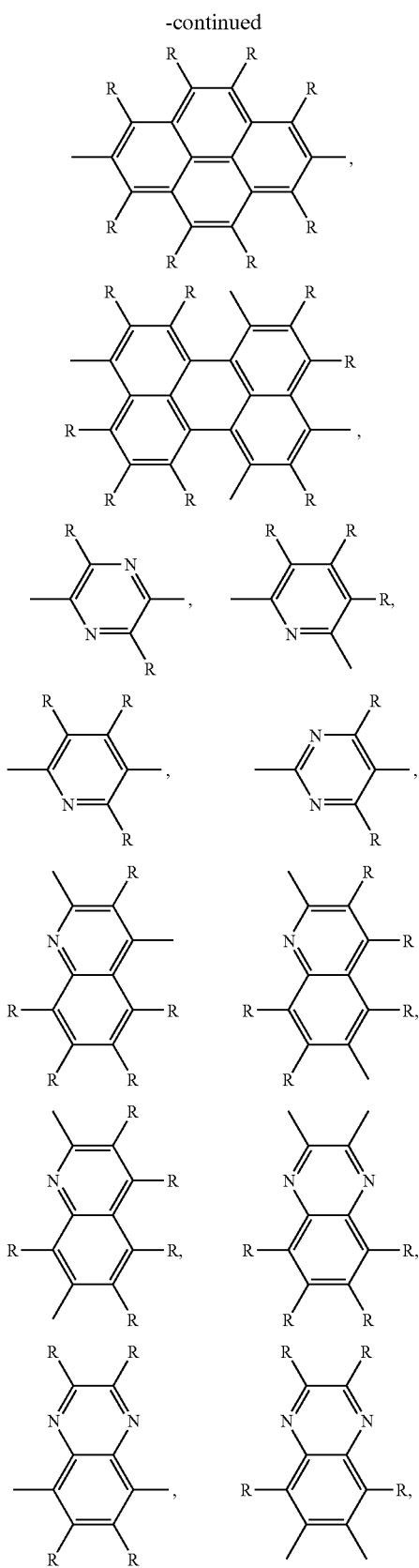
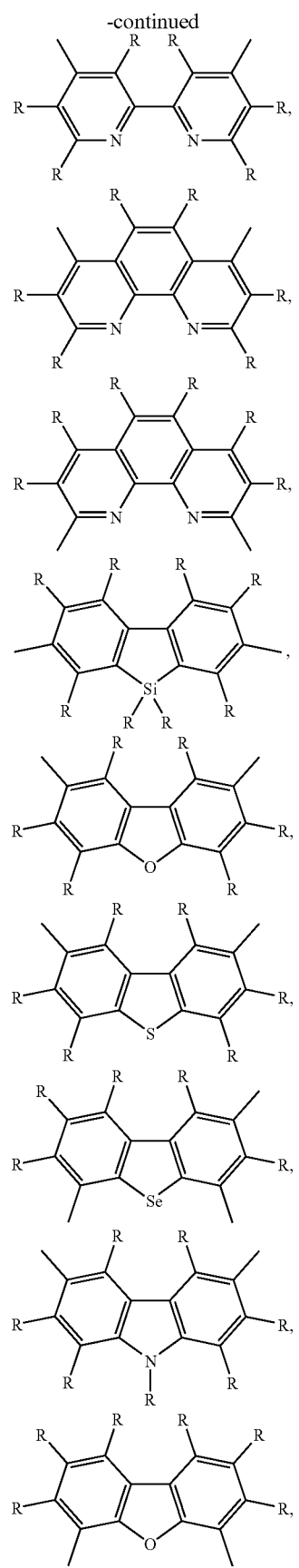

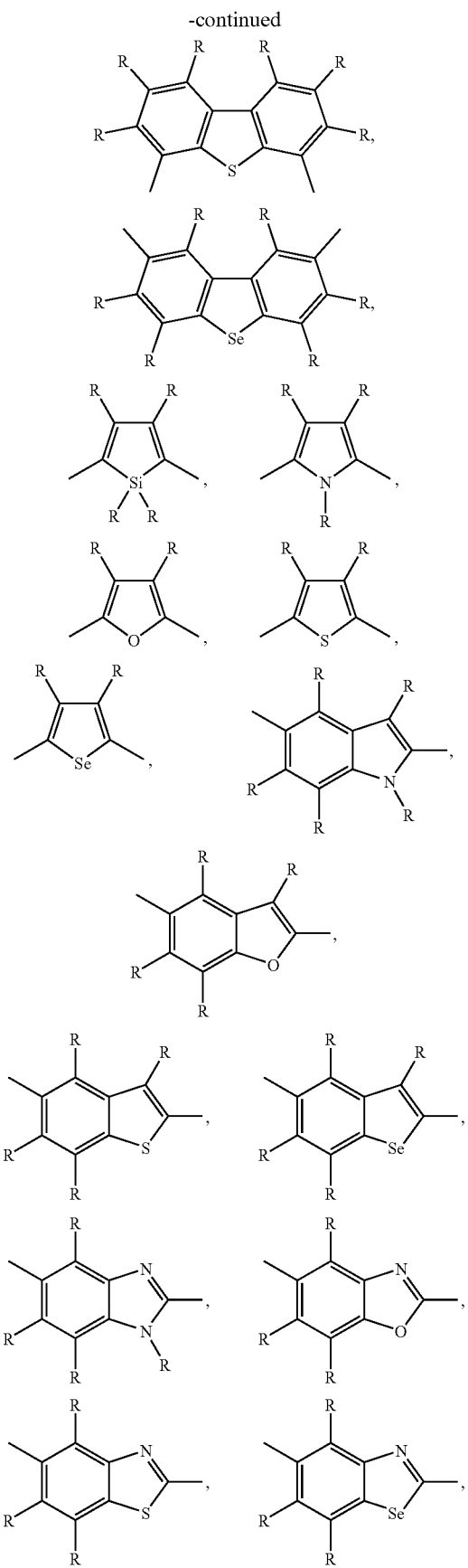

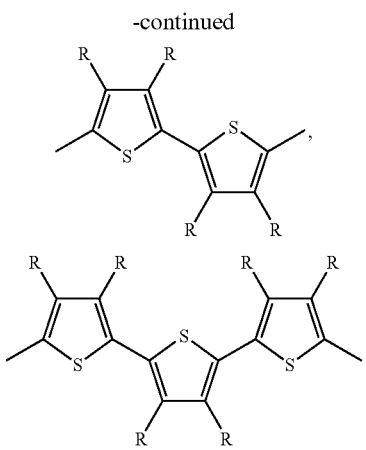

Among them, 1,4-phenylene, 2,6-naphthylene, 4,4'-biphenylene, anthracene-9,10-diyl, 2,5-pyridindiyl, and 2,5-thienylene groups or nuclear substitution derivatives thereof; or 1,3-phenylene, 1,3-naphthylene, 3,3'-biphenylene, 2,4-pyridinediyl, and 2,5-quinolinediyl groups or derivative groups thereof are preferred. The fluorescence wavelength of the polymeric fluorescent substance can be relatively easily regulated by properly selecting these groups.

In chemical formula (1), X, Y, and Z represent at least one group selected from the group consisting of an oxygen atom, a sulfur atom, a carbonyl group, a group represented by —C(R)$_2$—, and a group represented by —NR—. They may be the same or different and may be each independently selected. Specific examples of the structure of X, Y and Z are as follows:

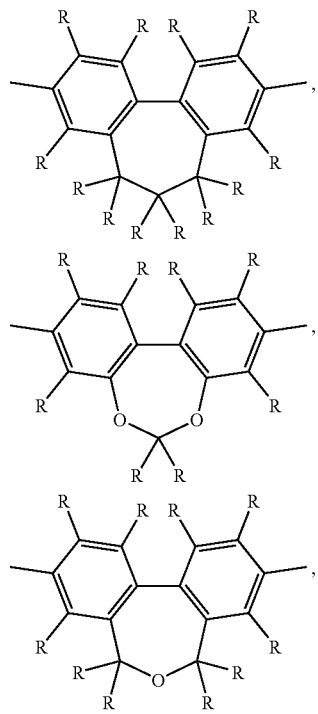

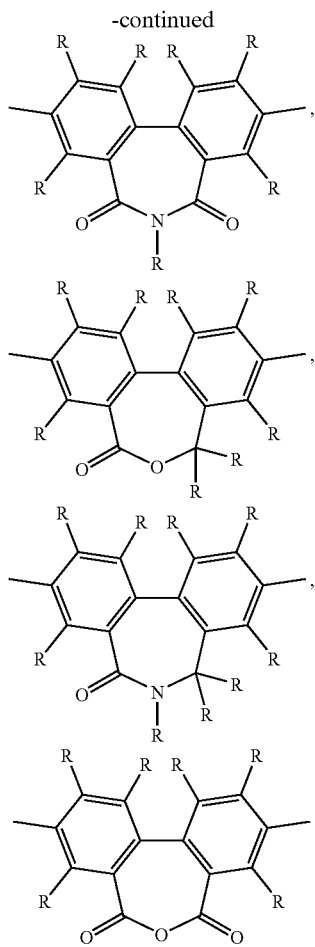

R in formulae indicated as examples of Ar, R in the group represented by —C(R)$_2$— and the group represented by —NR— as X, Y and Z, and R$^1$ to R$^6$ in chemical formula (1) represent at least one group selected from the group consisting of a hydrogen atom, an alkyl group having 1 to 20 carbon atoms, an alkoxy group having 1 to 20 carbon atoms, an alkylsilyl group having 1 to 60 carbon atoms, an alkylamino group having 1 to 40 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, an arylalkynyl group having 8 to 60 carbon atoms, an arylamino group having 6 to 60 carbon atoms, a heterocylic compound group having 4 to 60 carbon atoms, a cyano group, a nitro group, and a halogen atom.

Alkyl groups having 1 to 20 carbon atoms include methyl, ethyl, n-propyl, i-propyl, n-butyl, i-butyl, sec-butyl, t-butyl, n-hexyl, n-octyl, nonyl, decyl, and lauryl groups. Among them, pentyl, hexyl, octyl, and decyl groups are preferred.

Alkoxy groups having 1 to 20 carbon atoms include methoxy, ethoxy, propyloxy, butoxy, pentyloxy, hexyloxy, heptyloxy, octyloxy, nonyloxy, decyloxy, and lauryloxy groups. Among them, pentyloxy, hexyloxy, octyloxy, and decyloxy groups are preferred. Alkylthio groups having 1 to 20 carbon atoms include methylthio, ethylthio, propylthio, butylthio, pentylthio, hexylthio, heptylthio, octylthio, nonylthio, decylthio, and laurylthio groups. Among them, pentylthio, hexylthio, octylthio, and decylthio groups are preferred.

Alkylsilyl groups having 1 to 60 carbon atoms include methylsilyl, ethylsilyl, propylsilyl, butylsilyl, pentylsilyl, hexylsilyl, heptylsilyl, octylsilyl, nonylsilyl, decylsilyl, laurylsilyl, trimethylsilyl, ethyldimethylsilyl, propyldimethylsilyl, butyldimethylsilyl, pentyldimethylsilyl, hexyldimethylsilyl, heptyldimethylsilyl, octyldimethylsilyl, nonyldimethylsilyl, decyldimethylsilyl, and lauryldimethylsilyl groups. Among them, pentylsilyl, hexylsilyl, octylsilyl, decylsilyl, pentyldimethylsilyl, hexyldimethylsilyl, octyldimethylsilyl, and decyldimethylsilyl groups are preferred.

Alkylamino groups having 1 to 40 carbon atoms include methylamino, ethylamino, propylamino, butylamino, pentylamino, hexylamino, heptylamino, octylamino, nonylamino, decylamino, laurylamino, dimethylamino, and diethylamino groups. Among them, pentylamino, hexylamino, octylamino, and decylamino groups are preferred.

Aryl groups having 6 to 60 carbon atoms include phenyl, $C_1$–$C_{12}$ alkoxyphenyl (wherein $C_1$–$C_{12}$ means that the number of carbon atoms is 1 to 12; the same shall apply hereinafter), $C_1$–$C_{12}$ alkylphenyl, 1-naphthyl, and 2-naphthyl groups. Among them, $C_1$–$C_{12}$ alkoxyphenyl and $C_1$–$C_{12}$ alkylphenyl groups are preferred.

Aryloxy groups having 6 to 60 carbon atoms include phenoxy, $C_1$–$C_{12}$ alkoxyphenoxy, $C_1$–$C_{12}$ alkylphenoxy, 1-naphthyloxy, and 2-naphthyloxy groups. Among them, $C_1$–$C_{12}$ alkoxyphenoxy and $C_1$–$C_{12}$ alkylphenoxy groups are preferred.

Arylalkyl groups having 6 to 60 carbon atoms include phenyl-$C_1$–$C_{12}$ alkyl, $C_1$–$C_{12}$ alkoxyphenyl-$C_1$–$C_{12}$ alkyl, $C_1$–$C_{12}$ alkylphenyl-$C_1$–$C_{12}$ alkyl, 1-naphthyl-$C_1$–$C_{12}$ alkyl, and 2-naphthyl-$C_1$–$C_{12}$ alkyl groups. Among them, $C_1$–$C_{12}$ alkoxyphenyl-$C_1$–$C_{12}$ alkyl and $C_1$–$C_{12}$ alkylphenyl-$C_1$–$C_{12}$ alkyl groups are preferred.

Arylalkyl groups having 6 to 60 carbon atoms include phenyl-$C_1$–$C_{12}$ alkyl, $C_1$–$C_{12}$ alkoxyphenyl-$C_1$–$C_{12}$ alkyl, $C_1$–$C_{12}$ alkylphenyl-$C_1$–$C_{12}$ alkyl, 1-naphthyl-$C_1$–$C_{12}$ alkyl, and 2-naphthyl-$C_1$–$C_{12}$ alkyl groups. Among them, $C_1$–$C_{12}$ alkoxyphenyl-$C_1$–$C_{12}$ alkyl and $C_1$–$C_{12}$ alkylphenyl-$C_1$–$C_{12}$ alkyl groups are preferred.

Arylalkoxy groups having 6 to 60 carbon atoms include phenyl-$C_1$–$C_{12}$ alkoxy, $C_1$–$C_{12}$ alkoxyphenyl-$C_1$–$C_{12}$ alkoxy, $C_1$–$C_{12}$ alkylphenyl-$C_1$–$C_{12}$ alkoxy, 1-naphthyl-$C_1$–$C_{12}$ alkoxy, and 2-naphthyl-$C_1$–$C_{12}$ alkoxy groups. Among them, $C_1$–$C_{12}$ alkylphenyl-$C_1$–$C_{12}$ alkoxy groups are preferred.

Arylamino groups having 6 to 60 carbon atoms include phenylamino, diphenylamino, $C_1$–$C_{12}$ alkoxyphenylamino, di($C_1$–$C_{12}$ alkoxyphenyl)amino, di($C_1$–$C_{12}$ alkylphenyl) amino, 1-naphthylamino, and 2-naphthylamino groups. Among them, $C_1$–$C_{12}$ alkylphenylamino and di($C_1$–$C_{12}$ alkylphenyl)amino groups are preferred.

Heterocyclic compound groups having 4 to 60 carbon atoms include thienyl, $C_1$–$C_{12}$ alkylthienyl, pyrrolyl, furyl, pyridyl, and $C_1$–$C_{12}$ alkylpyridyl groups. Among them, $C_1$–$C_{12}$ alkylthienyl and $C_1$–$C_{12}$ alkylpyridyl groups are preferred. Halogen atoms include fluorine, chlorine, bromine, and iodine atoms.

Among the examples of R and R$^1$ to R$^6$, alkyl-containing substituents may be straight chain, branched chain, or cyclic substituents or a combination of these substituents. Alkyl-containing substituents, which are not straight chain, include, for example, isoamyl, 2-ethylhexyl, 3,7-dimethyloctyl, cyclohexyl, and 4-$C_1$–$C_{12}$ alkylcyclohexyl groups.

Further, in chemical formula (1), at least one of a combination of R$^1$ and R$^2$, a combination of R$^3$ and R$^4$, and a combination of R$^2$ and R$^3$ may or may not combine together to form a saturated or unsaturated five-, six-, or seven-membered ring. In this case, the ring may be formed through a hetero atom (N, O, or S). Specific examples of this case will be described. When R¹ and R² combine together to form an unsaturated six-membered ring while R³ and R⁴ combine together to form an unsaturated six-membered ring, for example, a group represented by chemical formula (4) is possible.

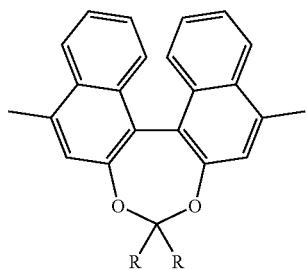
(4)

When R¹ and R² combine together to form a saturated six-membered ring while R³ and R⁴ combine together to form a saturated six-membered ring, for example, a group represented by chemical formula (5) is possible.

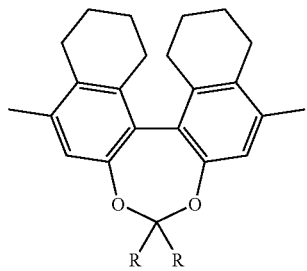
(5)

When R¹ and R² combine together to form a saturated five-membered ring through a hetero atom O while R³ and R⁴ combine together to form a saturated five-membered ring through a hetero atom N, for example, a group represented by chemical formula (6) is possible.

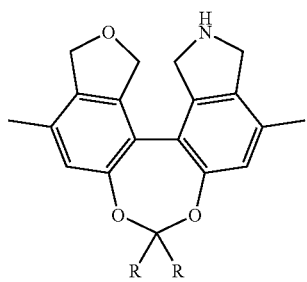
(6)

When R² and R³ combine together to form a seven-membered ring through a hetero atom O, for example, a group represented by chemical formula (7) is possible.

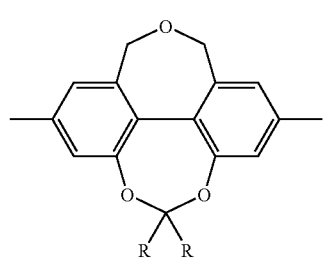
(7)

When X, Y, and Z represent a substituent represented by —C(R)₂— or —NR—, two Rs may or may not form a saturated or unsaturated five- or six-membered ring. In this case, the ring may be formed through a hetero atom (N, O, or S). Specific examples of this case include groups represented by chemical formulae (8-1) to (8-3).

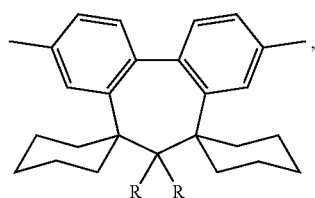
(8-1)

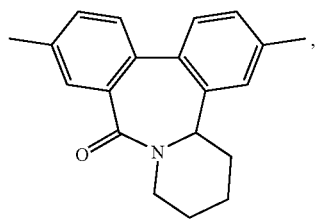
(8-2)

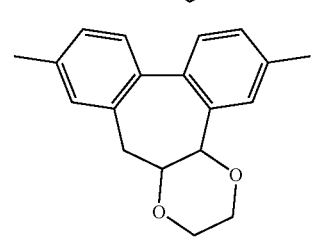
(8-3)

In the polymeric fluorescent substance according to the present invention, a seven-membered ring is contained in the repeating unit. Therefore, the polymer chain cannot take a planar configuration. This makes it difficult to pile up a plurality of polymer chains on top of one another and to form excimer and thus can offer such an excellent property that problems of shifting of the luminescence wavelength to a longer wavelength and lowered luminescence efficiency attributable to the excimer formation are less likely to occur. Stereoasymmetry having no asymmetric center exists in the seven-membered ring structure as the repeating unit. Optical resolution into either R or S may or may not be carried out. Random polymerization of R and S without optical resolution is preferred from the viewpoint of simple synthesis.

The total amount of the repeating units represented by chemical formula (1) is 50 to 100% by mole based on the total amount of all the repeating units. The total amount of the repeating units represented by chemical formula (1) is preferably 60 to 100% by mole, more preferably 70 to 100% by mole although it varies depending upon the structure of the repeating unit. Repeating units other than those represented by chemical formula (1) constituting the copolymer are not particularly limited so far as the above requirement is satisfied. Preferably, however, the repeating units other than those represented by chemical formula (1) constituting the copolymer have such a structure that does not lower solubility or fluorescence intensity.

The end group of the polymeric fluorescent substance according to the present invention is not particularly limited. However, when a polymerization active group remains intact, the luminescence properties or service life as the EL element are likely to be lowered. Therefore, the end group is preferably protected by a stable group.

Regarding the degree of polymerization of the polymeric fluorescent substance according to the present invention, the molecular weight is $10^3$ to $10^8$ as determined using polystyrene as a standard, preferably $10^4$ to $10^6$ from the viewpoints of solubility and film forming properties. The degree of polymerization also varies depending upon the structure and proportion of the repeating unit. From the viewpoint of film forming properties, preferably, the total number of repeating units is 2 to 10,000, more preferably 3 to 3,000, particularly preferably 4 to 1,000. Here the molecular weight is the number average molecular weight determined by gel permeation chromatography (GPC) (solvent: chloroform) using polystyrene as a standard.

The polymeric fluorescent substance according to the present invention is a polymer or copolymer in which the total amount of the repeating units represented by chemical formula (1) is not less than 50% by mole based on the total amount of all the repeating units. In the case of the copolymer, the form of the copolymer may be random, block, or graft. Alternatively, the copolymer may a polymer having a structure intermediate between these structures, for example, a random copolymer having a structure which is somewhat similar to the block copolymer.

The polymeric fluorescent substance according to the present invention may be dissolved in a solvent to prepare a solution which is then coated to form a film. Good solvents for the polymeric fluorescent substance according to the present invention include, for example, chloroform, methylene chloride, dichloroethane, tetrahydrofuran, toluene, and xylene. In general, the polymeric fluorescent substance can be dissolved in an amount of not less than 0.1% by weight in these solvents although the amount may also vary depending upon the structure and molecular weight of the polymeric fluorescent substance. In the preparation of a polymeric organic EL element, the use of the polymeric fluorescent substance soluble in these organic solvents is advantageous in that, when the formation of a film from a solution is contemplated, the film can be formed simply by coating the solution and then drying the coating to remove the solvent. This is highly beneficial for the preparation of the polymeric organic EL element.

In the production process of the polymeric fluorescent substance according to the present invention, a polymer comprising repeating units represented by chemical formula (1) is synthesized by a reaction for forming an aromatic carbon-aromatic carbon bond. The reaction for forming the aromatic carbon-aromatic carbon bond used in the present invention can be carried out, for example, by oxidative polymerization, a Grignard reaction, Suzuki coupling using a palladium catalyst, or Yamamoto coupling using a nickel catalyst. Among them, Suzuki coupling and Yamamoto coupling are preferred from the viewpoints of the control of the reaction, the control of the degree of polymerization, and yield. When the use of these polymers as a luminescent material for a polymeric organic EL element is contemplated, the purity of the polymer affects luminescent characteristics. Therefore, after the synthesis, preferably, the polymer is subjected to purification treatment, such as purification by reprecipitation or fractionation by chromatography.

Organic EL Element

The organic EL element includes a pair of opposed electrodes and an organic compound layer interposed between the pair of opposed electrodes. At least one of the pair of opposed electrodes is transparent or semitransparent. The organic compound layer has a single-layer or multilayer structure. The organic compound layer includes a layer containing at least one type of the polymeric fluorescent substance according to the present invention. The structure of the organic EL element according to the present invention is not particularly limited so far as the above requirement is satisfied, and any conventional structure may be adopted. Examples of structures, which may be adopted in the present invention, include one wherein a pair of electrodes are provided on respective sides of a luminescent layer formed of the polymeric fluorescent substance according to the present invention or a luminescent layer formed of a mixture of the polymeric fluorescent substance according to the present invention with a carrier transport material (which means a generic name of an electron transport material and a hole transport material), and one wherein an electron transport layer containing an electron transport material is interposed between a cathode and a luminescent layer or alternatively a hole transport layer containing a hole transport material is interposed between an anode and a luminescent layer. The luminescent layer and the carrier transport layer may have a single-layer structure or a multilayer structure of a combination of a plurality of layers which fall within the scope of the present invention. The luminescent layer may be formed of a mixture of the polymeric fluorescent substance according to the present invention with, e.g., the following luminescent material other than the polymeric fluorescent substance according to the present invention. Further, a layer of a dispersion of the polymeric fluorescent substance according to the present invention or a carrier transport material in a polymeric compound may be used.

The carrier transport material usable with the polymeric fluorescent substance according to the present invention, that is, the electron transport material or the hole transport material, may be any conventional electron transport material or hole transport material without particular limitation. Hole transport materials include, for example, pyrazoline derivatives, arylamine derivatives, stilbene derivatives, and triphenyldiamine derivatives. Electron transport materials include, for example, oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, and metal complexes of 8-hydroxyquinoline or its derivatives. Any one of the electron transport compound and the hole transport compound may be used, or alternatively both the electron transport compound and the hole transport compound may be simultaneously used. They may be used alone or as a mixture of two or more. When a carrier transport layer (which means a generic name of an electron transport layer and a hole transport layer) is provided between the luminescent layer and the electrode, the above carrier transport material may be used to form the carrier transport layer.

The conventional luminescent material usable with the polymeric fluorescent substance according to the present invention is not particularly limited, and examples thereof include naphthalene derivatives, anthracene or its derivatives, perylene or its derivatives, dyes such as polymethine dyes, xanthene dyes, coumarine dyes, and cyanine dyes, aromatic amines, tetraphenylcyclopentadiene or its derivatives, or tetraphenylbutadiene or its derivatives, and nano crystals of semiconductors having a bandgap value in visible region such as CdSe or CdS.

A representative preparation method of an organic EL element using the polymeric fluorescent substance according to the present invention will be described.

In order to provide a planar luminescent organic EL element, a construction is preferably adopted wherein at least one of the pair of electrodes of an anode and a cathode is transparent or semitransparent and luminescence is taken out from the transparent or semitransparent electrode side. The construction, however, is not limited to this only so far as luminescence is taken out from the end face of the element.

In the organic EL element, when luminescence is taken out from the substrate side, preferably, the substrate is transparent or semitransparent and, at the same time, the electrode provided on the substrate in the pair of electrodes of the organic EL element is transparent or semitransparent. Materials for the substrate include quartz, glass plates such as soda glass plates, metallic plates or foils, and plastics such as acrylic resins, styrene resins, and polycarbonate resins.

For example, electrically conductive metal oxide films or thin metal films are used in the electrode. Specifically, materials for the electrode include: electrically conductive metal oxides such as tin oxide, zinc oxide, indium oxide, and indium tin oxide (ITO); metals such as gold, silver, chromium, and nickel; organic electrically conductive materials such as polyaniline, polythiophene, and polypyrrole; and mixtures and laminates of the above materials. In particular, ITO is preferred as the anode, for example, from the viewpoint of high electrical conductivity and transparency.

Next, a luminescent layer containing, as a luminescent material, the polymeric fluorescent substance or a combination of the polymeric fluorescent substance with a carrier transport material is formed on the electrode. Particularly preferred methods for the formation of the luminescent layer include coating methods using a melt, a solution, a dispersion, or a mixed liquid of these materials, for example, spin coating, cast coating, dip coating, die coating, bead coating, bar coating, roll coating, spray coating, gravure coating, flexo printing, screen printing, and offset printing.

The thickness of the luminescent layer is 1 nm to 1 μm, preferably 2 to 500 nm, more preferably 5 to 200 nm. When the luminescent layer is formed by the coating method, preferably, heat drying at 30 to 300° C., preferably 60 to 200° C., under reduced pressure or in an inert atmosphere is carried out to remove the solvent.

When the luminescent layer and the carrier transport material are stacked on top of each other, preferably, a hole transport layer is formed on the anode before the luminescent layer is provided by the above film forming method, or alternatively an electron transport layer is formed after the formation of the luminescent layer. The carrier transport layer may be formed by any method without particular limitation. Examples of methods usable for carrier transport layer formation include vacuum deposition using a solid material and methods using a melt, a solution, a dispersion or a mixed liquid, for example, spin coating, cast coating, dip coating, die coating, bead coating, bar coating, roll coating, spray coating, gravure coating, flexo printing, screen printing, and offset printing. The thickness of the carrier transport layer is 1 nm to 1 μm, preferably 2 to 500 nm, more preferably 5 to 200 nm.

Next, an electrode is provided on the luminescent layer or the carrier transport layer. This electrode is a cathode. The cathode is preferably formed of a material having a work function of less than 4 eV from the viewpoint of easiness in electron injection. Materials usable for the cathode include: alkali metals, for example, lithium, sodium, and cesium, and halides thereof, for example, lithium fluoride, sodium fluoride, cesium fluoride, lithium chloride, sodium chloride, and cesium chloride; alkaline earth metals, for example, calcium and magnesium, and halides thereof, for example, calcium fluoride, magnesium fluoride, calcium chloride, and magnesium chloride; metals such as aluminum and silver; electrically conductive metal oxides; and alloys or mixtures of the above materials.

The cathode may be prepared, for example, by vacuum deposition, sputtering, or lamination involving contact bonding of a metallic thin film. After the preparation of the cathode, a protective layer for protecting the organic EL element may be provided. The provision of a protective layer or a protective cover is preferred from the viewpoint of protecting the organic EL element from the external influence to stably use the organic EL element for a long period of time. Materials usable for the protective layer include polymeric compounds, metal oxides, metal fluorides, metal borides, silicon oxide, and silicon nitride. For example, a glass plate or a plastic plate having a surface subjected to water permeability reducing treatment may be used as the protective cover. A suitable method for the provision of the protective cover is that this cover is laminated onto the substrate of the element with the aid of a heat-curable resin or photocurable resin followed by hermetical sealing.

When the preparation of a sheet element using the organic EL element according to the present invention is contemplated, an anode sheet and a cathode sheet are put on top of each other. Methods for providing pattern-wise luminescence include a method wherein a mask having a window pattern is provided on the surface of the luminescent element sheet, a method wherein the thickness of the organic layer in the nonluminescent part is made very thick to render this part substantially nonluminescent, and a method wherein any one of the anode and the cathode is formed in a pattern form or alternatively both the anode and the cathode are formed in a pattern form.

Methods usable for the preparation of a dot matrix element include a method wherein both the anode and the cathode are formed in a stripe form and are disposed orthogonally to each other and a method wherein one of the electrodes is constructed so as to be selectively driven by TFT. Further, the arrangement of a plurality of organic EL elements different from each other in luminescent color in an identical plane can realize partial color display, multicolor display, and full-color display.

EXAMPLES

The following Examples further illustrate but do not limit the present invention.

Example 1

(Synthesis of Polymeric Fluorescent Substance 1)

A dibromoaryl compound represented by chemical formula (9) was dissolved in dry tetrahydrofuran under a dry nitrogen gas stream to prepare a solution. 2-Isopropoxy-4,4,5,5-tetramethyl-1,3,2-dioxaborolane was added dropwise to the solution under ice cooling. The mixture was then stirred at 0° C. for one hr and then at room temperature for 12 hr.

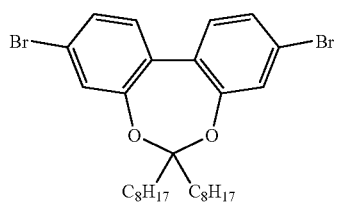

(9)

Water was added dropwise thereto, followed by extraction with diethyl ether. The extract was dehydrated and dried over anhydrous magnesium sulfate, and the solvent was then removed. The residue was washed with ethanol and was then recrystallized from an ether/hexane mixed solvent to give an aryldiborolane compound. The dibromoaryl compound, aryldiborolane compound, and tetrakis(trisphenylphosphine)palladium were dissolved in toluene under a nitrogen gas stream to prepare a solution. A 2 M aqueous sodium carbonate solution was added to the solution, and the mixture was then stirred at 100° C. for 48 hr. After cooling, the reaction solution was poured into methanol. The solid matter was washed with dilute hydrochloric acid and was added to acetone as a solvent, followed by reflux in a Soxhlet's reflux device to remove the dissolved component and to separate insolubles. The insolubles were dissolved in chloroform and were reprecipitated from methanol to give the target polymer represented by chemical formula (10).

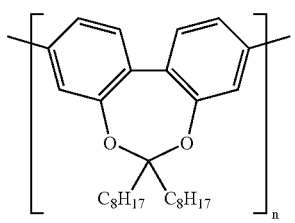

(10)

The polymer thus obtained will be hereinafter referred to as "polymeric fluorescent substance 1." The number average molecular weight of polymeric fluorescent substance 1 using polystyrene as a standard was determined by gel permeation chromatography (GPC) with chloroform as a solvent and was found to be $4.0 \times 10^4$. Regarding the structure of the polymeric fluorescent substance 1, the corresponding spectrum was obtained in $^1$H-NMR and IR spectrum.

(Synthesis of Polymeric Fluorescent Substance 2)

Particulate metallic lithium was stirred at high speed in dry diethyl ether under a dry nitrogen gas stream, and 1-bromooctane was gradually added thereto to produce octyllithium. Diethyl diphenate was dissolved in dry diethyl ether under a dry nitrogen gas stream to prepare a solution. A solution of octyllithium in diethyl ether was added dropwise to the solution at −78° C., and the mixture was stirred for one hr. Water was added dropwise thereto, followed by extraction with diethyl ether. The extract was dehydrated and dried over anhydrous magnesium sulfate, and the solvent was then removed. The residue was subjected to flash column chromatography with an ethyl acetate/hexane mixed solvent to separate a diol compound.

The diol compound was dissolved in dry tetrahydrofuran under a dry nitrogen gas stream to prepare a solution. p-Toluenesulfonic acid was added to the solution, and the mixture was stirred with heating at 200° C. for 5 hr. The reaction mixture was cooled to room temperature, was washed with water, and was dehydrated and dried over anhydrous magnesium sulfate, and the solvent was then removed. The residue was subjected to flash column chromatography with an ethyl acetate/hexane mixed solvent to separate an aryl compound represented by chemical formula (11).

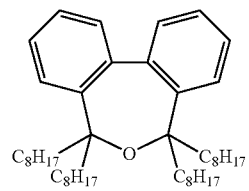

(11)

The aryl compound was dissolved in chloroform to prepare a solution. Iron(III) chloride was added to the solution, and bromine was added thereto at 0° C. The mixture was stirred for 15 hr. The reaction solution was washed with an aqueous sodium thiosulfate solution and was dehydrated and dried over anhydrous magnesium sulfate, and the solvent was then removed. The residue was subjected to flash column chromatography with an ethyl acetate/hexane mixed solvent to separate a dibromoaryl compound.

The dibromoaryl compound was dissolved in dry tetrahydrofuran under a dry nitrogen gas stream to prepare a solution. 2-Isopropoxy-4,4,5,5-tetramethyl-1,3,2-dioxaborolane was added dropwise to the solution under ice cooling. The mixture was then stirred at 0° C. for one hr and then at room temperature for 12 hr. Water was added dropwise thereto, followed by extraction with diethyl ether. The extract was dehydrated and dried over anhydrous magnesium sulfate, and the solvent was then removed. The residue was washed with ethanol and was then recrystallized from an ether/hexane mixed solvent to give an aryldiborolane compound.

The dibromoaryl compound, aryldiborolane compound, and tetrakis(trisphenylphosphine)palladium were dissolved in toluene under a nitrogen gas stream to prepare a solution. A 2 M aqueous sodium carbonate solution was added to the solution, and the mixture was then stirred at 100° C. for 48 hr. After cooling, the reaction solution was poured into methanol. The solid matter was washed with dilute hydrochloric acid and was added to acetone as a solvent, followed by reflux in a Soxhlet's reflux device to remove the dissolved component and to separate insolubles. The insolubles were dissolved in chloroform and were reprecipitated from methanol to the target polymer represented by chemical formula (12). The polymer thus obtained will be hereinafter referred to as "polymeric fluorescent substance 2."

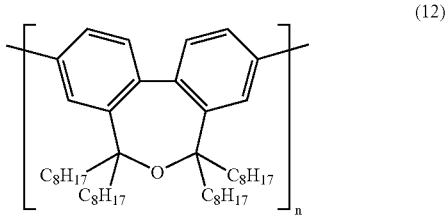

(12)

The number average molecular weight of polymeric fluorescent substance 2 using polystyrene as a standard was determined by gel permeation chromatography (GPC) with chloroform as a solvent and was found to be $2.3 \times 10^4$. Regarding the structure of the polymeric fluorescent substance 2, the corresponding spectrum was obtained in $^1$H-NMR and IR spectrum.

(Measurement of Absorption Spectrum and Fluorescence Spectrum)

Both polymeric fluorescent substances 1 and 2 could easily be dissolved in chloroform to prepare chloroform solutions. The chloroform solutions were spin coated onto a quartz plate to form a thin film of polymeric fluorescent substance 1 and a thin film of polymeric fluorescent substance 2. For the thin films, an ultraviolet/visible ray absorption spectrum and a fluorescence spectrum were measured with an ultraviolet/visible ray absorption spectrum measuring device MPC-3100 manufactured by Shimadzu Seisakusho Ltd. and a fluorescence spectrophotometer F-4500 manufactured by Hitachi, Ltd.

For polymeric fluorescent substance 1, the absorption peak wavelength was 355 nm, and the fluorescence had a peak wavelength of 452 nm and was blue. For polymeric fluorescent substance 2, the absorption peak wavelength was 348 nm, and the fluorescence had a peak wavelength of 445 nm and was blue.

Example 2

(Evaluation of Thermal Stability)

A chloroform solution of polymeric fluorescent substance 1 and a chloroform solution of polymeric fluorescent substance 2 were spin coated onto a quartz substrate to form a thin film of polymeric fluorescent substance 1 and a thin film of polymeric fluorescent substance 2. The coated substrates were heated on a hot plate in a dry nitrogen atmosphere at 120° C. for 24 hr. Before heating, the fluorescence had a peak wavelength of 452 nm for the thin film of polymeric fluorescent substance 1 and had a peak wavelength of 445 nm for the thin film of polymeric fluorescent substance 2 and was blue. After heating, the fluorescence peak wavelength for the thin film of polymeric fluorescent substance 1 and the fluorescence peak wavelength of the thin film of polymeric fluorescent substance 2 remained unchanged and were 452 nm and 445 nm, respectively, and, for both the films, the fluorescent color was blue.

Comparative Example

A chloroform solution of poly(9,9-dioctylfluorene) was spin coated onto a quartz plate as a substrate to form a thin film. The coated substrate was heated on a hot plate at 120° C. for 24 hr in a dry nitrogen atmosphere. Before heating, for the thin film of poly(9,9-dioctylfluorene), the fluorescence had a peak wavelength of 423 nm and was blue. After heating, the fluorescence peak wavelength of the thin film of polyfluorene was shifted to a longer wavelength, i.e., 515 nm, that is, the fluorescent color was green.

Example 3

(Preparation and Evaluation of Organic EL Element)

A substrate prepared by forming a transparent conductive film of ITO on a glass substrate was patterned in a desired form, was then washed, and was subjected to UV/ozone treatment. Next, a water dispersion of poly-3,4-ethylenedioxythiophene/polystyrenesulfonate (abbreviation: PEDOT/PSS, tradename: Baytron PTP AI 4083, manufactured by Bayer) was dropped on the washed substrate to perform spin coating. Thereafter, the coating was heat dried on a hot plate of 140° C. for 10 min to form a 100 nm-thick hole transport layer.

Subsequently, a toluene solution of polymeric fluorescent substance 1 was dropped on the hole transport layer to perform spin coating. The coating was then heat dried on a hot plate at 100° C. under reduced pressure to form a 100 nm-thick electron transport/luminescent layer. Further, a 20 nm-thick metallic calcium layer was formed by vacuum deposition in a vacuum of $1.0 \times 10^{-6}$ Torr at a rate of 0.2 nm/sec, and an 80 nm-thick silver layer was formed thereon by vacuum deposition at a rate of 2 nm/sec to form an electrode.

An external power supply (source meter 2400 manufactured by Keithley Instruments, Inc.) was connected to the organic EL element thus obtained. DC voltage was applied across the ITO as the anode and the metallic electrode as the cathode. As a result, blue luminescence having a spectrum corresponding to fluorescence of the polymeric fluorescent substance was obtained. The brightness of this element was measured with a luminance meter BM-8 manufactured by Topcon Corp. Further, a luminescence spectrum was measured with a spectroradiometer SR-2 manufactured by Topcon Corp. When the applied voltage was 6.8 V, luminescence occurred at 100 cd/m$^2$. The efficiency in luminescence at 100 cd/m$^2$ was 2.3 cd/A.

Example 4

(Synthesis of Polymeric Fluorescent Substance)

Polymeric fluorescent substances represented by formulae (13) to (26) were synthesized in the same manner as in Example 1. The maximum fluorescence wavelength of each of the fluorescent substances was measured in the same manner as described above and data on maximum fluorescence wavelength are appended to individual chemical formulae. EL elements were prepared in the same manner as in Examples 2 and 3, except that the polymeric fluorescent substances prepared in this example were used. The properties of the EL elements thus obtained were examined and found to be the same as those obtained in Examples 2 and 3.

-continued
(13)
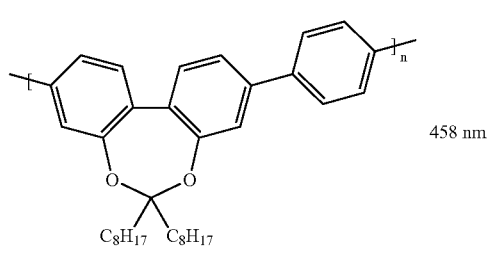
458 nm
(14)
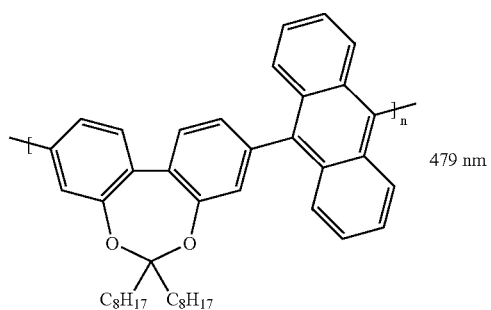
479 nm
(15)
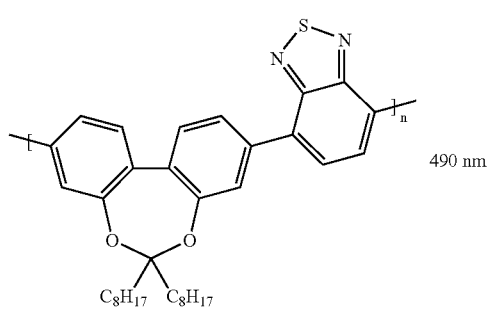
490 nm
(16)
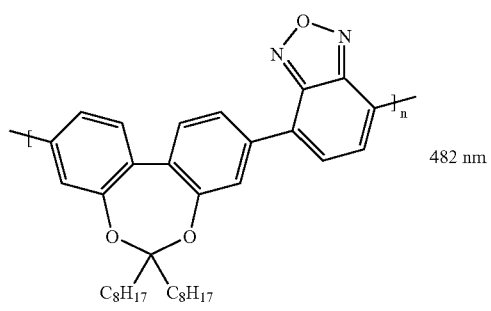
482 nm
(17)
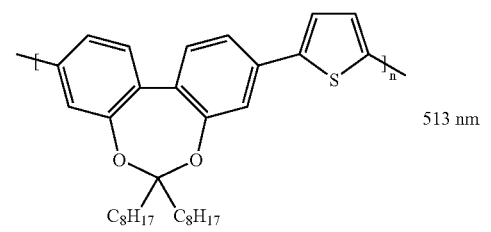
513 nm
(18)
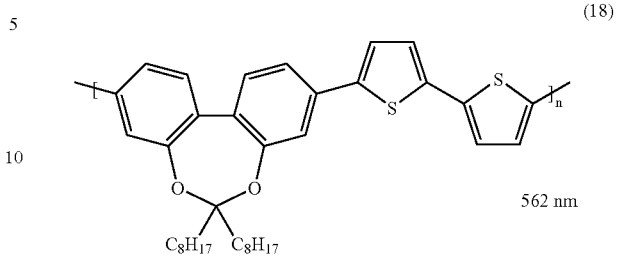
562 nm
(19)
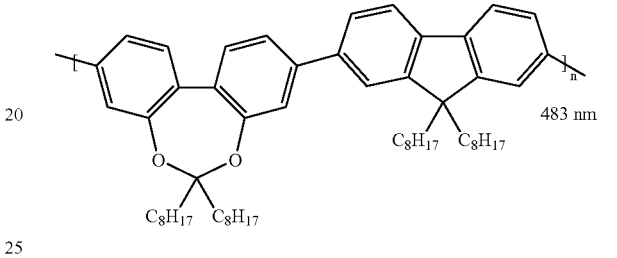
483 nm
(20)
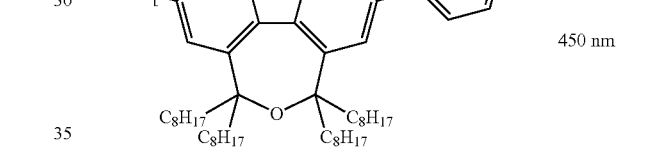
450 nm
(21)
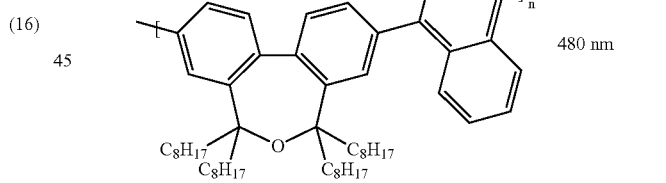
480 nm
(22)
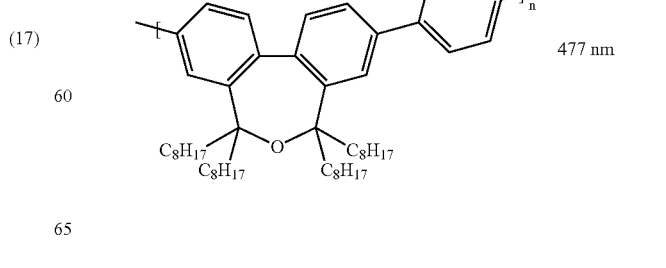
477 nm -continued

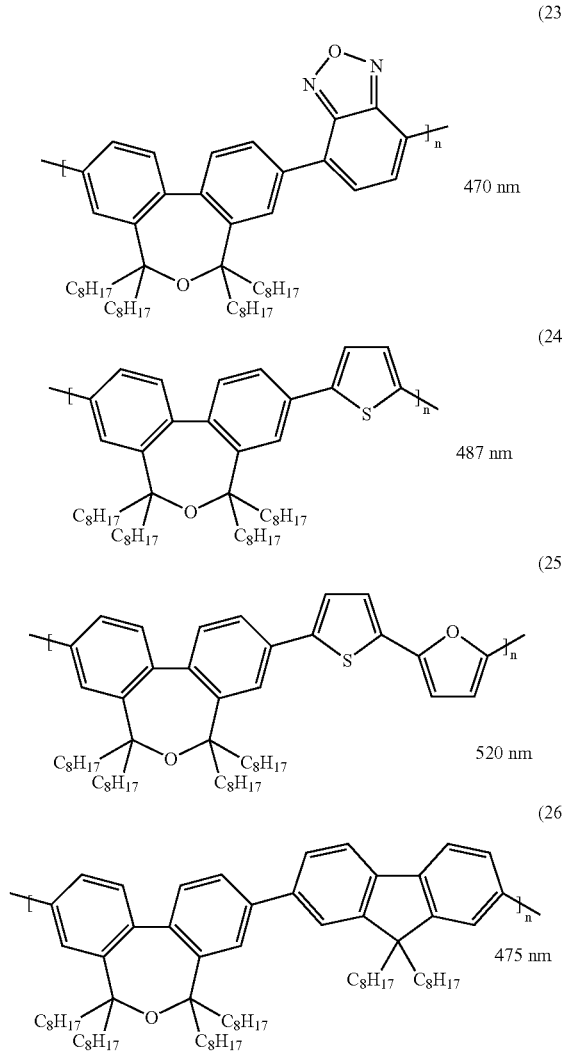

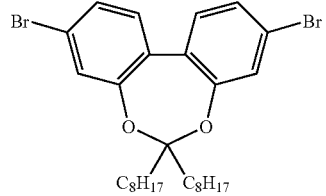

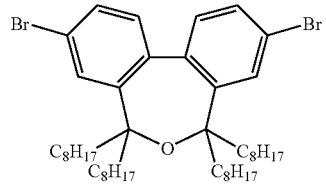

and said polymeric fluorescent substance having a number average molecular weight of $10^3$ to $10^8$.

2. A process for producing the polymeric fluorescent substance according to claim 1, comprising the step of polymerizing a monomer represented by chemical formula (3-1) or (3-2) of claim 1, or polymerizing said monomer represented by chemical formula (3-1) or (3-2) of claim 1 in combination with an aromatic compound having 6 to 60 carbon atoms involved in conjugation, or with a heterocyclic compound having 4 to 60 carbon atoms involved in conjugation.

3. An organic electroluminescent element comprising a pair of opposed electrodes, an anode and a cathode, and an organic compound layer interposed between said pair of opposed electrodes, said organic compound layer including a layer containing at least one type of polymeric fluorescent substance as defined in claim 1.

4. The organic electroluminescent element according to claim 3, wherein a layer containing an electron transport compound is provided between said cathode and a luminescent layer.

5. The organic electroluminescent element according to claim 3, wherein a layer containing a hole transport compound is provided between said anode and a luminescent layer.

6. The organic electroluminescent element according to claim 3, wherein a layer containing an electron transport compound is provided between said cathode and a luminescent layer and a layer containing a hole transport compound is provided between said anode and said luminescent layer.

The invention claimed is:

1. A polymeric fluorescent substance adapted for emission of visible fluorescence in a solid state, said polymeric fluorescent substance comprising at least one type of repeating units represented by chemical formula (3-1) or (3-2):

* * * * *